US009018681B2

(12) United States Patent
Gridelet et al.

(10) Patent No.: US 9,018,681 B2
(45) Date of Patent: Apr. 28, 2015

(54) METHOD OF MANUFACTURING A BIPOLAR TRANSISTOR AND BIPOLAR TRANSISTOR

(75) Inventors: Evelyne Gridelet, Omal (BE); Tony Vanhoucke, Bierbeek (BE); Johannes Josephus Theodorus Marinus Donkers, Valkenswaard (NL); Hans Mertens, Leuven (BE); Blandine Duriez, Brussels (BE)

(73) Assignee: NXP B.V., Eindhoven (NL)

( * ) Notice: Subject to any disclaimer, the term of this patent is extended or adjusted under 35 U.S.C. 154(b) by 606 days.

(21) Appl. No.: 13/303,099

(22) Filed: Nov. 22, 2011

(65) Prior Publication Data

US 2012/0132999 A1 May 31, 2012

(30) Foreign Application Priority Data

Nov. 26, 2010 (EP) .................................. 10192803

(51) Int. Cl.
| | | |
|---|---|---|
| H01L 29/732 | (2006.01) | |
| H01L 21/8249 | (2006.01) | |
| H01L 27/06 | (2006.01) | |
| H01L 29/08 | (2006.01) | |
| H01L 29/10 | (2006.01) | |
| H01L 29/66 | (2006.01) | |

(52) U.S. Cl.
CPC ........ *H01L 21/8249* (2013.01); *H01L 27/0623* (2013.01); *H01L 29/0813* (2013.01); *H01L 29/1004* (2013.01); *H01L 29/66287* (2013.01); *H01L 29/7322* (2013.01)

(58) Field of Classification Search
None
See application file for complete search history.

(56) References Cited

U.S. PATENT DOCUMENTS

| 5,665,202 | A  * | 9/1997 | Subramanian et al. ....... 438/692 |
| 7,074,685 | B2 | 7/2006 | Magnee et al. |
| 7,554,174 | B2 | 6/2009 | Seo et al. |
| 2008/0227262 | A1* | 9/2008 | El-Kareh et al. .............. 438/343 |
| 2010/0001369 | A1* | 1/2010 | Chuang et al. ................ 257/526 |

FOREIGN PATENT DOCUMENTS

| EP | 0 951 074 A2 | 10/1999 |
| EP | 2 372 754 A1 | 10/2011 |
| EP | 2 418 681 | 2/2012 |
| EP | 2 506 297 | 10/2012 |
| WO | 03/100845 A1 | 12/2003 |

(Continued)

OTHER PUBLICATIONS

Tilke, A. T. et al. "A Low-Cost Fully Self-Aligned SiGe BiCMOS Technology Using Selective Epitaxy and a Lateral Quasi-Single-Poly Integration Concept", IEEE Transactions on Electron Devices, vol. 15, No. 7, pp. 1101-1107 (Jul. 2004).

(Continued)

*Primary Examiner* — Wensing Kuo

(57) ABSTRACT

Consistent with an example embodiment, there is method of manufacturing a bipolar transistor comprising providing a substrate including an active region; depositing a layer stack; forming a base window over the active region in said layer stack; forming at least one pillar in the base window, wherein a part of the pillar is resistant to polishing; depositing an emitter material over the resultant structure, thereby filling said base window; and planarizing the deposited emitter material by polishing. Consistent with another example embodiment, a bipolar transistor may be manufactured according to the afore-mentioned method.

15 Claims, 3 Drawing Sheets

(56) References Cited

FOREIGN PATENT DOCUMENTS

Figure 1A:
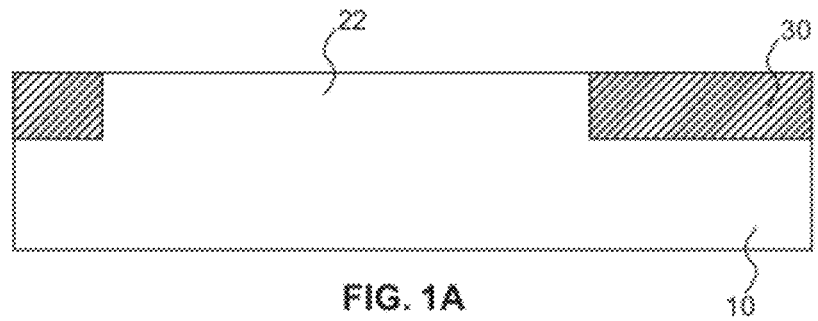

| WO | 2006/129292 A2 | 12/2006 |
| WO | 2010/066630 A1 | 6/2010 |

OTHER PUBLICATIONS

Tuinhout, H. P. "Electrical Characterisation of Matched Pairs of Evaluation of Integrated Circuit Technologies", Technische Universiteit Delft, 259 pgs., retrieved from the internet at: repository.tudelft.nl/assets/uuid...0027.../its_tuinhout_20051215.pdf (Dec. 15, 2005).

Fox, A. et al. "SiGe HBT Module with 2.5 ps Gate Delay", Electron Devices Mgt., 2008 IEDM IEEE Int'l., 4 pgs., (Dec. 2008).

U.S. Appl. No. 13/205,932, filed Aug. 9, 2011.

U.S. Appl. No. 13/299,755, filed Nov. 18, 2011.

Extended European Search Report for Patent Appln. No. 10192803.4 (Apr. 20, 2011).

\* cited by examiner

METHOD OF MANUFACTURING A BIPOLAR TRANSISTOR AND BIPOLAR TRANSISTOR

This application claims the priority under 35 U.S.C. §119 of European patent application no. 10192803.4, filed on Nov. 26, 2010, the contents of which are incorporated by reference herein.

FIELD OF THE INVENTION

The present invention relates to a method of manufacturing a bipolar transistor comprising providing a substrate including an active region; depositing a layer stack; and forming a base window at least partially over the active region in said layer stack.

The present invention further relates to a bipolar transistor manufactured in accordance with such a method.

BACKGROUND OF THE INVENTION

Nowadays, many electronic devices incorporate functionality that operates at radio frequencies, such as mobile communication devices. The implementation of such functionality in a cost-effective manner is far from trivial. It is well-known that bipolar transistors are particularly suitable for handling signals in the radio frequency (RF) domain. However, the manufacture of integrated circuits (ICs) based on silicon bipolar transistor technology is more costly than for instance complementary metal oxide semiconductor (CMOS) ICs, and the downscaling of the device feature size is more easily achieved in CMOS technology. The cost-effective nature of CMOS technology has led to the acceptance of CMOS technology as the mainstream technology of choice for the manufacture of a wide variety of semiconductor components including ICs.

However, the breakdown characteristics of CMOS transistors limit the usefulness of CMOS transistors in RF applications unless costly measures are implemented in the CMOS process to improve these characteristics. Such costly measures typically prohibit the use of RF-CMOS technologies for manufacturing small volume devices such as analog mixed signal (AMS) devices. For these reasons, efforts have been made to produce bipolar transistors using a CMOS process flow, thereby providing mixed technology ICs in which bipolar transistors can be used for handling RF signals. An example of such an IC is provided in WO2010/066630 A1.

The challenge that process developers face is that the number of alterations to the CMOS process should remain small whilst at the same time yielding good quality bipolar transistors that are capable of handling high frequency signals. An example of a low-complexity IC including a heterojunction bipolar transistor formed in a CMOS process flow can for instance be found in WO 2003/100845 A1.

Nevertheless, the applicability of such CMOS technology-based bipolar transistors is not without problems. It is particularly difficult to manufacture several identical bipolar transistors that have relatively wide emitter areas. Wide emitter areas are needed for instance for bipolar transistors that must be capable of handling large currents. To create identical bipolar transistors process variations between different bipolar transistors on the same chip need to be minimized. The latter may for instance be required when implementing a current mirror, where the ratio between the two current sources has to be as precisely defined as possible to ensure reliable operation of the current mirror.

The main problem with establishing relatively large emitter areas, e.g. base windows having a width in excess of 2 μm is that during the planarizing of the emitter material deposited on the substrate with the purpose to fill the base window, not only excess emitter material is removed from outside the base window but also from inside the base window. This is known as dishing, and is particularly problematic when using chemical mechanical polishing (CMP). The CMP step typically stops at a polishing-resistant layer over the substrate such as a $Si_3N_4$ nitride layer. When increasing the dimensions (width or length) of the base window (it is noted that the dimensions of the base window govern the dimensions of the emitter), due to the relative softness of the emitter material such as poly-Si when planarizing the resultant structure after the poly-Si deposition in a CMP step, the dishing effect can become so pronounced for base windows having a width in excess of 2 μm that substantially all emitter material is removed from inside the base window.

SUMMARY OF THE INVENTION

The present invention seeks to provide a method of manufacturing a bipolar transistor according to the opening paragraph in which the base window dimensions and thus emitter dimensions can be increased without requiring additional process steps.

The present invention further seeks to provide a bipolar transistor manufactured in this manner.

According to an aspect of the present invention, there is provided a method of manufacturing a bipolar transistor comprising providing a substrate including an active region; depositing a layer stack over the substrate; forming a base window at least partially over the active region in said layer stack; forming at least one pillar in the base window, wherein at least a part of the pillar is resistant to polishing; depositing an emitter material over the resultant structure, thereby filling said base window; and planarizing the deposited emitter material by polishing.

The present invention is based on the realization that the provision of at least one pillar with at least a part resistant to polishing, dishing of the emitter material in the base window during a planarizing polishing step such as a CMP step can be largely avoided, thus extending the maximum dimensions of the emitter, i.e. its maximum width and length, that can be achieved.

In an embodiment, the layer stack includes an insulating layer, a conductive layer and a protection layer such as a nitride layer.

At this point, it is noted that it is known to prevent CMP dishing between different devices by putting tiles or CMP dummies of several layers such as poly silicon, STI, and so on around individual transistors. In the prior art, tiling is mostly an automated process and tiles are not surrounded by regions where charge carriers flow in order to keep the chip functional. In contrast, in the present invention, dedicated CMP dummies consisting of small pillars are placed such as surrounded by a region where the charge carriers flow inside a single device, i.e. in the base window, to facilitate the manufacture of relatively wide or long devices. The pillars act as tiles and prevent a polishing pad from brushing too deep into the relatively soft emitter material, e.g. poly-Si, thereby significantly reduce dishing of the emitter region. It should be understood that for smaller width bipolar transistors, CMP dummies may be omitted.

In an example embodiment, the pillar is a layer stack pillar formed simultaneously with the formation of the base window. As this only requires changing the layout of the base window mask, the pillars may be formed without requiring additional process steps.

In another example embodiment, the protection layer is a nitride layer, as nitride and in particular $Si_3N_4$ layers have good selectivity behavior for polishing steps such as CMP.

The method further comprises growing an epitaxial layer in the base window; and forming said sidewall spacers on said epitaxial layer prior to depositing the emitter material. This allows for a high-quality base to be formed inside the base window, with the epitaxial layer preferably comprising a SiGe:C layer, with the carbon content in the SiGe layer prohibiting the outdiffusion of boron impurities in the SiGe layer from reaching the emitter material.

In accordance with another aspect of the present disclosure, there is provided a heterojunction bipolar transistor comprising a substrate including an active region; a base/emitter stack on the substrate over the active region, said base/emitter stack comprising a base layer over the active region and an emitter region over the base layer, the base/emitter stack further surrounding a at least one pillar extending through the base layer and the emitter region, said pillar having at least a part resistant to polishing. The presence of the pillar with the part resistant to polishing surrounded by the base/emitter stack ensures that the base/emitter stack can be extended compared to prior art devices, as the excess emitter material can be removed by CMP without dishing effects as previously explained.

The base/emitter stack of the bipolar transistor may surround a plurality of said pillars, which preferably are not placed in a line, as this further increases the achievable dimensions of the base/emitter stack without the emitter being significantly adversely affected by CMP dishing and with minimum detrimental effect on the transistor performance. With the present invention, it is possible to routinely produce bipolar transistors such as heterojunction bipolar transistors (HBTs) or bipolar junction transistors (BJTs) in which the width of the base window in which the base/emitter stack is formed is at least 2 µm.

Such a bipolar transistor may be integrated in an integrated circuit (IC), preferably an IC further comprising at least one field effect transistor, in particular a MOS transistor. Such an IC can be manufactured in a cost-effective manner whilst being suitable for use in RF application domains such as AMS processing.

BRIEF DESCRIPTION OF THE EMBODIMENTS

Figure 1B:
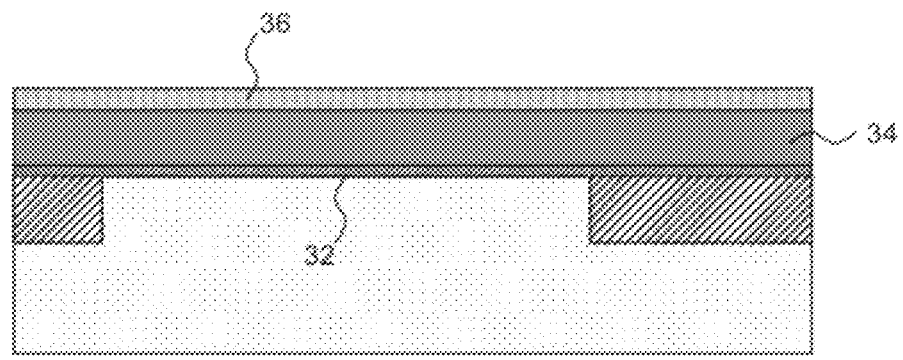
Figure 1C:
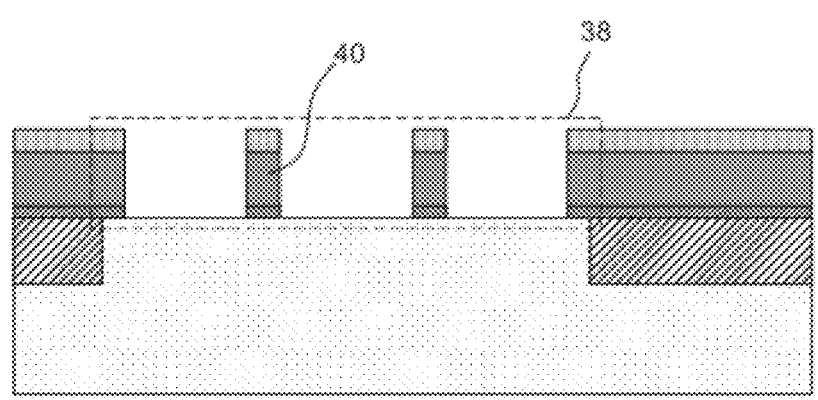
Figure 1D:
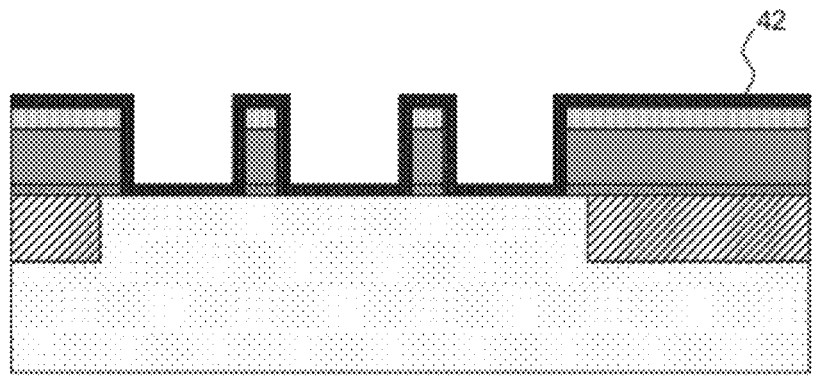
Figure 1E:
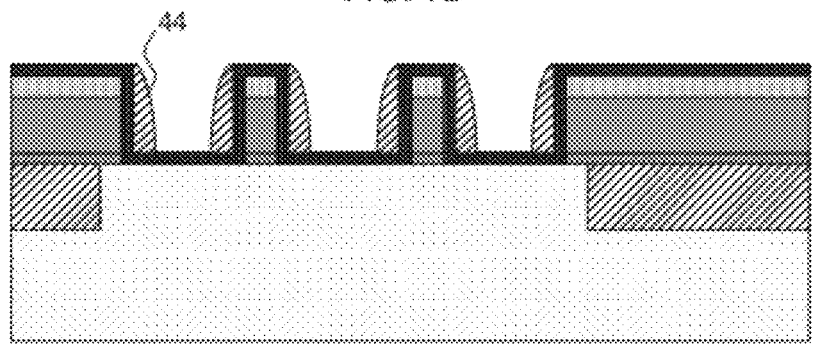
Figure 1F:
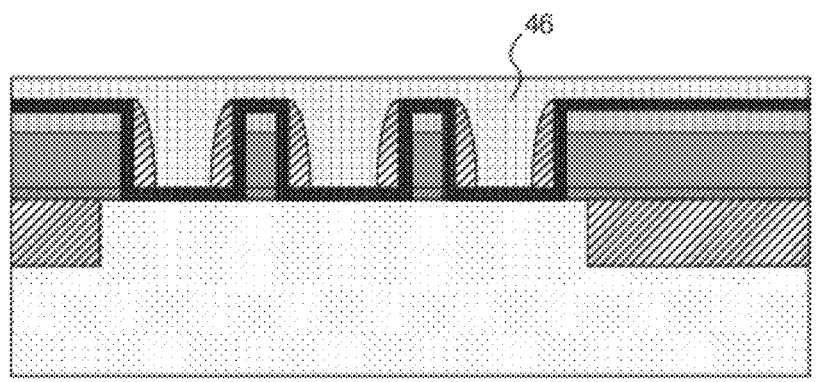
Figure 1G:
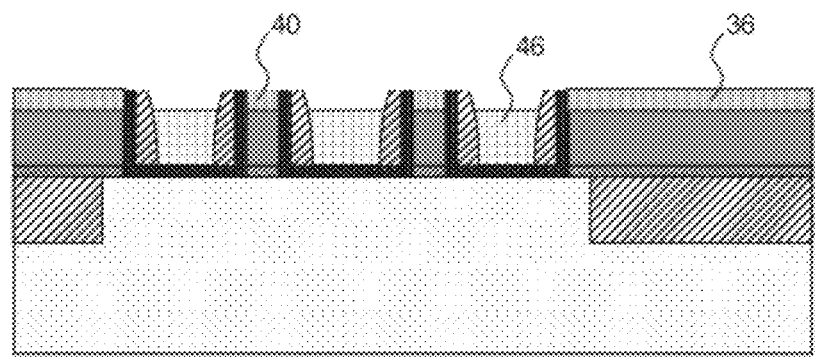
Figure 2:
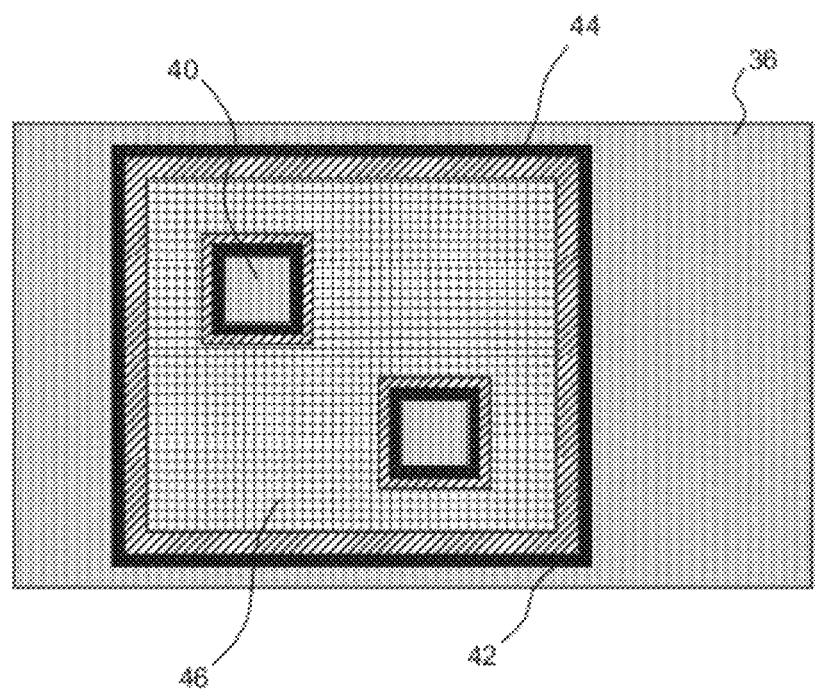

Embodiments of the invention are described in more detail and by way of non-limiting examples with reference to the accompanying drawings, wherein FIGS. 1A-1G schematically depicts an embodiment of the method of the present disclosure; and FIG. 2 schematically depicts a top view of a bipolar transistor according to an embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIGS. 1A-1G show a first embodiment of the method of the present invention. In FIG. 1A, a substrate 10 is provided in which an active region 22 is formed. The substrate 10 may be any suitable substrate, such as a silicon substrate and so on. The substrate 10 typically at some stage comprises a collector region (not shown), which may be formed in any suitable manner, e.g. by the formation of an epitaxial layer or by implantation. Implantation is more cost-effective. The active region is bordered by lateral isolation such as shallow trench isolation (STI) 30. The formation of STI 30 in a substrate 10 is well-known and is not further explained for the sake of brevity.

In FIG. 1B, the gate dielectric 32 such as a low-k dielectric or silicon oxide ($SiO_2$) 32 is grown, followed by the deposition of the conductive material 34 such as a poly-Si layer and a protection layer 36, which preferably is a nitride layer such as a $Si_3N_4$ layer. Again, the formation of such layers is well-known and may be achieved in any suitable manner.

The layer stack formed in step (b) shown in FIG. 1B, is opened as shown in FIG. 1C, to form the base window 38 by means of a base window etch to expose the active region 20. To this end, a patterned photo resist layer (not shown) may be formed over the protection layer 36, which includes an opening exposing the region of the protection layer 36 in which the base window is to be formed. In an embodiment, the base window etch is performed using a number of selective etch steps to selectively remove the protection layer 36, e.g. using a nitride etch, followed by a selective etch to remove the conductive layer 34, e.g. a poly-Si etch recipe including $CF_4$, $Cl_2$, HBr and $O_2$ and a selective etch to remove the dielectric or insulating layer 32, e.g. by using a selective oxide etch.

The base window mask (not shown) for forming the base window 38 is adjusted such that at least one pillar 40 of the layer stack remains inside the base window 38. Although not specifically shown, a selectively implanted collector (SIC) may be implanted into the active region 22 of the substrate 10 at this stage, and subsequently annealed. Any suitable impurity, e.g. As, may be used for this implant. Following this implant, the photoresist layer defining the base window 38 may be removed in any suitable manner, e.g. by stripping.

In a preferred embodiment, the base window 38 has a rectangular shape, with the CMP dummies or pillars 40 formed of the insulating layer 32, conductive layer 34 and protective layer 36. The CMP dummies or pillars 40 can be squares with sides of 0.2 to 0.6 µm, but it should be understood that the pillars 40 can have any other suitable shape. A base window 38 typically comprises between 1 and 10 CMP dummies 40, although the base window 38 may comprise a larger number of CMP dummies or pillars 40, depending on the size of the pillars 40 and the size of the base window 38. The pillars 40 are preferably not placed in a line. The reason for this is that charge carriers also have to flow laterally in the base layer of the bipolar transistor. If the pillars 40 are placed in line, e.g. in a row, it has been found that this has a detrimental effect on the charge carrier mobility, thereby increasing the base resistance. Moreover, the resistance to dishing is better if the pillars 40 are not placed in-line.

The method proceeds as shown in FIG. 1D, in which a base layer 42 is epitaxially grown over the resultant structure. Prior to the growth of the epitaxial base layer 42, the exposed silicon surfaces may be passivated by a hydrogen bake. In a preferred embodiment, the base layer 42 is a layer stack comprising an undoped Si layer to promote the nucleation of a SiGe:C layer on nitride, an undoped SiGe:C collector-base spacer, a boron-doped SiGe:C base, an undoped SiGe:C base-emitter spacer a doped Si emitter cap. The carbon content is preferably around 0.2% and the germanium content is preferably around 20% in the aforementioned layers. The carbon in the SiGe:C layers prevents the outdiffusion of boron impurities from the boron-doped base, as is known per se. However, it should be understood that the exact composition and structure of the base in the HBT of the present invention is not important; any suitable base construction may be chosen. It is noted that the epitaxial growth of the base layer 42 also increases the dimensions of the pillars 40 as the base layer 42 is also formed on the pillars 40.

As shown in FIG. 1E, sidewall spacers 44 are subsequently formed in the base window 38. In a non-limiting example, the side wall spacers 44 are formed as an ONO stack, i.e. by forming a layer of tetraethyl orthosilicate (TEOS) over the exposed surfaces of the base window 38, followed by a nitride liner deposition and another TEOS deposition, which is subsequently treated to a $C_4F_8$/Ar-based etch recipe to form the sidewall spacers, with the nitride liner of the ONO stack acting as an etch stop layer. The exposed nitride liner may be removed from the surface of the resultant structure by a suitable nitride etch, e.g. a wet etch in $H_3PO_4$. It is noted that the formation of the sidewall spacers 44 further increases the thickness of the pillars 40.

As shown in FIG. 1F, the emitter material 46 is deposited over the resultant structure, thereby filling the base window 38. In a preferred embodiment, the emitter material is As-doped polysilicon (poly-Si). It may be necessary to first remove any remaining sidewall spacer material, e.g. TEOS, from the epitaxial base layer 42 at the bottom of the base window 38. The emitter material 46 may be deposited in any suitable manner. After deposition of the emitter material 46, the resultant structure is subjected to a polishing step, preferably a CMP step to remove excess emitter material 46, as shown in FIG. 1G. As the polishing step is terminated on the protective layer 36, the portions of this layer that form the polishing tiles on top of the pillars 40 prevent excessive dishing of the emitter regions 46 in the base window.

At this stage, it is noted that although the placement of pillars 40 in the active region of the emitter 46 will not detrimentally affect transistor performance, it will decrease the emitter area and therefore the total current capacity of the bipolar transistor such as a HBT or BJT. For example, for a device with a rectangular base window 38 having dimensions (L×W) of 3×5.12 μm and an off-set due to the epitaxial base layer 42 and sidewall spacers 44 of 0.2 μm on each side, the emitter 46 effective area is (5.12−2*0.2)*(3−2*0.2)=12.272 μm² without CMP dummies 40. The inclusion of two square CMP dummies 40 in the emitter region having sides of 0.4 μm long reduces the effective area of the emitter 46 by 2*(0.4+2*0.2)²=1.28 um². This means that the active area consumed by the CMP dummies or pillars 40 is only 10% of the emitter area. At the same time, the increase in emitter resistance will also be of the order of 10%. However, both area, i.e. total current, and emitter resistance can be compensated for by a small increase of the width or length of the base window 38 of the HBT to restore an active area of 12.272 um².

FIG. 2 shows a top view of a bipolar transistor manufactured in accordance with an embodiment of the method of the present invention. The protective layer 36 surrounds a base/emitter stack formed in the base window including the epitaxially grown base layer 42, electrically insulating sidewall spacers 44 and an emitter material 46, preferably poly-Si, in which one or more pillars 40 are formed having an exposed surface of a polish-resistant material such as a nitride to prevent excessive dishing of the emitter material 46 in the base window 38. The expansion of the pillars 40 by the epitaxial base layer 42 and the sidewall spacers 44 can also be recognized in FIG. 2. It will be obvious to the skilled person that the top view schematically depicted in FIG. 2 is not a finalized bipolar transistor, further processing steps including the removal of the protection layer 36 and the subsequent formation of the emitter, base, collector and substrate contacts (not shown) are typically required to complete the bipolar transistor of the present invention. However, since such processing steps can be routinely implemented by the skilled person, they have not been explicitly described for the sake of brevity.

At this point, it is emphasized that it is preferable that the pillars 40 are formed at the same time as the formation of the base window 38, as this simply requires the inclusion of the pillars 40 in the base window mask such that the pillars 40 can be produced at no additional cost to the manufacturing process. This is an important improvement over the state of the art where the CMP process had to be adjusted to reduce the dishing of the emitter region 46, which required significant additional investment and had limited effect as such adjustment could not prevent the dishing in very wide emitters, e.g. bipolar transistors having base windows of several μm wide.

Nevertheless, it should be understood that it is not necessary to form the pillars 40 at the same time as the base window 38. In an alternative embodiment, the base window 38 may be formed whilst stopping on the insulating layer 32, after which the base window 38 may be filled e.g. with a suitable polish-resistant material such as a nitride and subsequently patterned to form the pillars 40, after which the insulating layer 32 is removed and the method proceeds as shown in step (d) of FIG. 1. This is of course a more costly approach as it requires additional processing steps as well as an additional mask to form the pillars 40, but it would lead to the same technical result, i.e. the prevention of the excessive dishing of the emitter region 46 in a polishing step such as a CMP step. Other variations in which the pillars 40 are formed after the formation of the base window 38 will be apparent to the skilled person.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a bipolar transistor comprising:
   providing a substrate including an active region;
   depositing a layer stack over the substrate;
   forming a base window at least partially over the active region in said layer stack;
   forming at least one pillar in the base window;
   depositing an emitter material over the resultant structure, thereby filling said base window; and
   planarizing the deposited emitter material by polishing; and
   wherein at least a part of the pillar is resistant to polishing with respect to the layer stack and the emitter material.

2. The method of claim 1, wherein said layer stack includes an insulating layer, a conductive layer and a protection layer over the substrate.

3. The method of claim 1, wherein said planarizing step is performed by chemical mechanical polishing.

4. The method of claim 1, wherein the at least one pillar is a layer stack pillar formed simultaneously with the formation of the base window.

5. The method of claim 1, further comprising
growing an epitaxial layer in the base window; and
forming said sidewall spacers on said epitaxial layer prior to depositing the emitter material.

6. A bipolar transistor comprising:
a substrate including an active region;
a base/emitter stack on the substrate over the active region, said base/emitter stack comprising a base layer over the active region and an emitter region over the base layer, the base/emitter stack further surrounding a at least one pillar extending through the base layer and the emitter region, at least a part of said pillar having a resistance to polishing with respect to the base/emitter stack.

7. The bipolar transistor of claim 6, wherein the base layer comprises vertical portions bordering the emitter region, the sidewalls of the emitter region are electrically insulated from the vertical portions by respective sidewall spacers.

8. The bipolar transistor of claim 6, wherein the base layer comprises an epitaxially grown SiGe:C layer.

9. The bipolar transistor of claim 6, wherein the base/emitter stack surrounds a plurality of said pillars.

10. The bipolar transistor of claim 9, wherein said pillars are not placed in a line.

11. The bipolar transistor of claim 6, wherein an upper surface is a nitride layer.

12. The bipolar transistor of claim 10, wherein the at least one pillar comprises an insulating layer, a conductive layer and a nitride layer.

13. The bipolar transistor of claim 6, wherein the width of the emitter region is at least 2 μm.

14. An integrated circuit comprising the bipolar transistor of claim 6.

15. The integrated circuit of claim 14, further comprising at least one field effect transistor, in particular a MOS transistor.

* * * * *